United States Patent [19]

Jones et al.

[11] Patent Number: 5,541,450
[45] Date of Patent: Jul. 30, 1996

[54] LOW-PROFILE BALL-GRID ARRAY SEMICONDUCTOR PACKAGE

[75] Inventors: Tim Jones, Chandler; Denise Ommen, Phoenix; John Baird, Scottsdale, all of Ariz.

[73] Assignee: Motorola, Inc., Schaumburg, Ill.

[21] Appl. No.: 333,188

[22] Filed: Nov. 2, 1994

[51] Int. Cl.$^6$ .............................. H01L 23/48; H01L 23/52
[52] U.S. Cl. .......................... 257/697; 257/738; 257/777; 257/780
[58] Field of Search .................................. 257/697, 738, 257/777, 778, 780

[56] References Cited

U.S. PATENT DOCUMENTS

| | | | |
|---|---|---|---|
| 3,811,186 | 5/1974 | Larnerd et al. | 29/626 |
| 4,878,611 | 11/1989 | LoVasco et al. | 228/180.2 |
| 5,045,921 | 9/1991 | Lin et al. | 257/780 |
| 5,056,215 | 10/1991 | Blanton | 29/840 |
| 5,291,062 | 3/1994 | Higgins, III | 257/698 |
| 5,355,283 | 10/1994 | Marrs et al. | 361/760 |
| 5,367,193 | 11/1994 | Malladi | 257/707 |
| 5,397,921 | 3/1995 | Karnezos | 257/779 |
| 5,424,492 | 6/1995 | Petty et al. | 174/250 |
| 5,444,296 | 8/1995 | Kaul et al. | 257/686 |

Primary Examiner—Robert P. Limanek
Assistant Examiner—David B. Hardy
Attorney, Agent, or Firm—Kevin B. Jackson

[57] ABSTRACT

A ball-grid array (BGA) semiconductor package (10,60,90) includes a substrate (31,61,91) attached to a support substrate (32,62 92). The substrate (31,61,91) has an opening (33) extending from an upper surface to a lower surface. An integrated circuit chip (18) is attached to the support substrate (32,62,92) within the opening (33). Bond pads (22) on the integrated circuit chip (18) are electrically connected to ball pads (42,73,106,108) on the lower surface of the substrate (31,61,91). Conductive solder balls (26) are attached to the ball pads (42,73,106,108). The support substrate (32,62,92) provides a low profile and functions as a standoff that limits the collapse of the conductive solder balls (26) when the BGA semiconductor package (10,60,90) is attached to an application board (46).

15 Claims, 2 Drawing Sheets

LOW-PROFILE BALL-GRID ARRAY SEMICONDUCTOR PACKAGE

BACKGROUND OF THE INVENTION

This invention relates, in general, to semiconductor packages, and more particularly, to ball-grid array semiconductor packaging.

Ball-grid array (BGA) semiconductor packages are well known in the electronics industry. BGA packages typically comprise a substrate, such as a printed circuit board, with a semiconductor die having a multitude of bond pads mounted to the top side of the substrate. Wire bonds electrically connect the bond pads to a series of metal traces on the top side of the printed circuit board. This series of metal traces is connected to a second series of metal traces on the back side of the printed circuit board through a series of vias located around the outer periphery of the printed circuit board. The second series of metal traces each terminate with a contact pad where a conductive solder ball is attached. The conductive solder balls are arranged in an array pattern and have a pitch on the order of 1.5 millimeters (mm). Typically, the semiconductor die and wire bonds are encapsulated with a molding compound.

In order to reduce manufacturing costs, the electronics industry is increasing the usage of perimeter BGA packages. In perimeter BGA packages, the conductive solder balls are arranged in an array pattern on the back side of the printed circuit board between the vias and the semiconductor die. The inner-most conductive solder balls typically are beneath or in close proximity to the outer edges of the semiconductor die.

Users of BGA packages, particularly in computer, communication, and personal electronic applications, are demanding smaller, lighter and thinner (less than 1.5 mm) BGA packages to support, among other things, portability. Also, users are requiring a smaller pitch distance between the conductive solder balls in order to support higher pin counts within the same package footprint area. In addition, users are requiring improved conductor routing to the package. Furthermore, users are pushing for BGA packages that are more reliable under increasingly demanding operating conditions.

Existing BGA packages have several disadvantages including a high profile on the order of 2.4 millimeters (mm); collapse of the solder balls at reflow to a height determined by ball and ball pad size; and a fatigue failure rate of the solder joints during temperature cycling based on the higher strain levels in solder joints with lower height to diameter ratios.

Accordingly, there exists a need for a BGA package that supports the electronics industry's demand for a perimeter solder ball array, that has a low-profile (less than 1.5 mm), that has a reduced susceptibility to solder reflow collapse, that has a reduced rate of solder joint failure under temperature cycling, and that is cost effective.

DETAILED DESCRIPTION OF THE DRAWINGS

Figure 1:
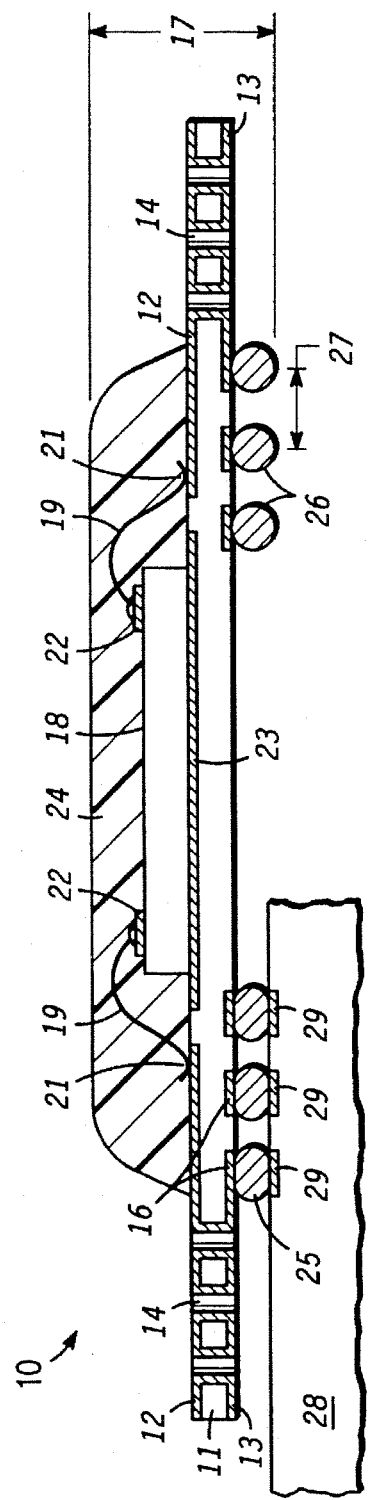
FIG. 1 illustrates a cross-sectional view of a prior art perimeter BGA package.

FIG. 1 illustrates a cross-sectional view of a prior art perimeter BGA package 10. BGA package 10 comprises a substrate 11 having top conductive traces 12 formed on an upper surface of substrate 11. Substrate 11 typically is formed from an organic epoxy-glass resin based material, such as bismaleimide-triazin (BT) resin or FR-4 board. Bottom conductive traces 13 are formed on a lower surface of substrate 11 and are electrically connected to top conductive traces 12 through vias or plated through-holes 14. Vias 14 extend from the upper surface of substrate 11 to the lower surface. Vias 14 contain a conductive material such as copper. Top conductive traces 12 terminate with bond posts or pads 21. Bottom conductive traces 13 terminate with ball or terminal pads 16. Top conductive traces 12, bottom conductive traces 13, ball pads 16, and bond posts 21 comprise a electrically conductive material such as copper or copper plated with gold. Not all top conductive traces 12, bottom conductive traces 13, and vias 14 are shown to avoid overcrowding the drawing.

BGA package 10 further comprises an integrated circuit or semiconductor die 18 attached to a die attach pad 23 on the upper surface of substrate 11. Semiconductor die 18 is attached to die attach pad 23 using an epoxy. Semiconductor die 18 has a plurality of bonding or bond pads 22 formed on an upper surface. Each of the plurality of bond pads 22 is electrically connected to top conductive traces 12 with a wire bond 19. Typically, semiconductor die 18, wire bonds 19, and a portion of substrate 11 are covered by an encapsulating enclosure 24.

Conductive solder balls 26 are each attached to a ball pad 16. Conductive solder balls 26 are metallurgically wetted to ball pads 16 during a reflow process. The inner-most conductive solder balls 26 are typically underneath or adjacent to semiconductor die 18. Conductive solder balls 26 are spaced a pitch 27 apart, which is typically on the order of 1.0 to 1.8 mm. Conductive solder balls 26 are later connected to a next level of assembly or printed circuit board 28 using a standard solder reflow process. Conductive solder balls 26 connect to contact pads 29 to form solder joints 25. After the mounting process, solder joints 25 take a flattened spherical shape defined by solder volume and wetting areas. The number and arrangement of conductive solder balls 26 on the lower surface of substrate 11 depends on circuit requirements including input/output (I/O), power and ground connections.

BGA package 10 has several disadvantages. BGA package 10 typically has a high profile with a height 17 on the order of 2.4 mm. Also, semiconductor die 18 exerts significant stress on those conductive solder balls 26 directly beneath or in close proximity to the outer edge of semiconductor die 18, when BGA package 10 is mounted to an application board and subjected to temperature cycling. This stress distorts the solder joints and can ultimately result in solder joint failure. Although BGA package 10 is shown in perimeter design, BGA packages having conductive solder balls across the lower surface of the package substrate and directly below the semiconductor die have at least the same disadvantages as BGA package 10.

Figure 2:
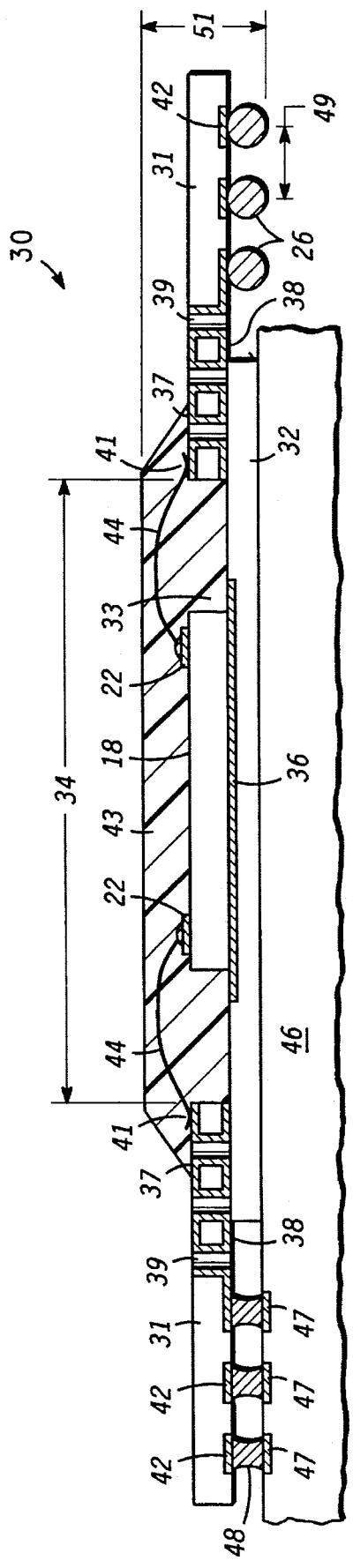
FIG. 2 illustrates a cross-sectional view of an embodiment of a perimeter BGA package according to the present invention.

FIG. 2 illustrates a cross-sectional view of an embodiment of a perimeter BGA package or structure 30 according to the present invention. BGA package 30 comprises a substrate structure including substrate 31 and a support or base substrate 32 attached to substrate 31. Substrate 31 has an opening or aperture 33 having a width 34, which forms a cavity with support substrate 32 as the lower cavity surface. Opening 33 extends from the top surface to the bottom surface of substrate 31 and is preferably substantially centrally located within substrate 31. Width 34 is chosen depending upon the size of semiconductor die 18 and die-bonding tolerances. Width 34 is typically on the order of 1 to 2 mm greater than semiconductor die 18. The width of support substrate 32 is greater than width 34 and less than the width of substrate 31. Support substrate 32 is attached to substrate 31 preferably using an epoxy. The height of support substrate 32 is less than the height of conductive solder balls 26 prior to reflow, but greater than unconstrained reflowed solder joints such as solder joints 25 shown in FIG. 1.

By using a two substrate construction comprising substrate 31 and support substrate 32, overall height 51 of BGA package 30 is reduced on the order of 0.9 to 1.4 mm or 42 to 58%, for example. Support substrate 32 and opening 33 provide a downset for semiconductor die 18, which minimizes the effect of die thickness on the overall package height.

Semiconductor die 18 is attached to die attach pad 36 using a die attach epoxy such as Sumitomo 1033B, for example, which is available from Sumitomo Inc. Die attach pad 36 can be a metal, bare PCB, or a ceramic. Bond pads 22 are electrically connected to conductive solder balls 26 with a conductive connective structure. In a preferred embodiment, the conductive connective structure includes a plurality of top conductive traces or lines 37 formed on the top surface of substrate 31. The conductive connective structure further includes a plurality of bottom conductive traces or lines 38 formed on the bottom surface of substrate 31. Top conductive traces 37 are connected to bottom conductive traces 38 through vias or plated through-holes 39. Vias 39 extend from the top surface to the bottom surface of substrate 31. Typically, one via of vias 39 couples one of top conductive traces 37 to one of bottom conductive traces 38. Top conductive traces 37 each terminate at one end with a bond post or pad 41. Bottom conductive traces 38 each terminate at one end with a conductive ball pad or contact 42. Only one set of upper and lower conductive traces is shown. A plurality of conductive solder balls or contacts 26 are each coupled to a conductive ball pad 42.

Conductive traces 37 and 38, bond post 41, and conductive ball pad 42 are formed on substrate 31 using conventional processing techniques that are well known to those skilled in the art. Conductive traces 37 and 38, bond post 41, and conductive ball pad 42 preferably comprise copper or copper plated with a combination of nickel and gold. Vias 39 are formed using a drill or laser process, depending on the thickness of the board. The sidewalls of vias 39 are then preferably covered with a layer of copper. Wire bonds or conductive wires 44 electrically connect one of the bond pads 22 to one of the bond posts 41. BGA package 30 is shown with a transfer molded plastic enclosure 43, which is formed using techniques well known in the art.

In a preferred embodiment, vias 39 are between opening 33 and the innermost portion of conductive solder balls 26.

This embodiment is preferred because it places conductive solder balls 26 further away from semiconductor die 18 without increasing the overall foot-print of the package. By placing conductive solder balls 26 further away from semiconductor die 18, less stress is imparted to the solder joints when BGA package 30 is mounted to an application board and subjected to temperature cycling. Also, for large pin count devices (>200 pins), when vias 39 are between opening 33 and the innermost portion of conductive solder balls 26, the number of conductive solder ball rows is reduced because pitch 49 is reduced. This makes trace routing easier because the traces to the innermost conductive solder balls pass through fewer rows.

FIG. 2 further illustrates a portion of BGA package 30 connected to a portion of an application or printed circuit (PC) board 46. PC board 46 has contact pads 47 where conductive solder balls 26 are attached to form solder joints 48. Typically, an infrared (IR) reflow or a vapor phase reflow process is used to connect BGA package 30 to PC board 46. These processes are well known in the art.

When BGA package 30 is mounted to PC board 46, support substrate 32 is in close proximity to PC board 46 and acts as standoff, which limits the collapse of conductive solder balls 26 during the mounting process. When the collapse is limited, the solder joints are taller than in standard BGA packages. Taller solder joints have been shown to be more reliable because the larger aspect ratio lowers solder joint strain. This provides an advantage over BGA package 10 because it allows a manufacturer to reduce pitch 49 between conductive solder balls 26 and therefore the size of solder balls 26 without sacrificing reliability. Also, this allows a manufacturer to increase the number of conductive solder balls 26 used without having to increase the foot-print of BGA package 30. Support substrate 32 also provides for a thinner profile of BGA package 30 compared to BGA package 10. When substrate 31 and support substrate 32 comprise an organic epoxy-glass resin, BGA package 30 has a height 51, which is on the order of 1.0 to 1.5 mm. This is significantly less than height 17 of BGA package 10.

In a alternative embodiment, support substrate 32 comprises a stress reducing material such as aluminum-nitride, which has a thermal coefficient of expansion (TCE) close to that of silicon. Also, aluminum-nitride has a high thermal conductivity, which improves the thermal performance of the package. When support substrate 32 comprises a stress reducing material, less stress is applied to semiconductor die 18 when BGA package 30 is subjected to temperature extremes. This further enhances the reliability of BGA package 30. The composition of the stress reducing material is selected so that its TCE substantially approaches the TCE of the material that semiconductor die 18 is comprised of.

Figure 3:
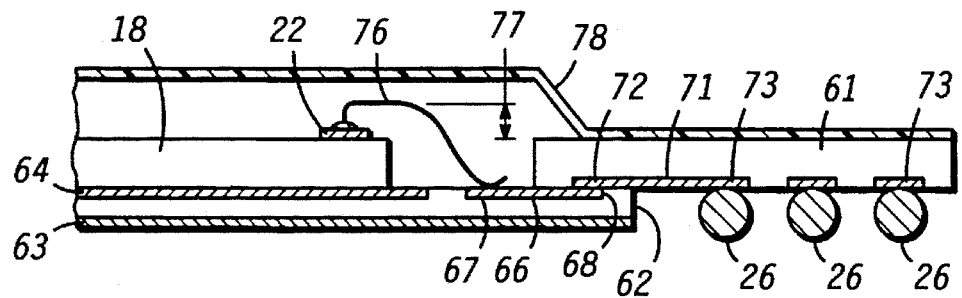
FIG. 3 illustrates a portion of a cross-sectional view of another embodiment of a perimeter BGA package according to the present invention.

FIG. 3 illustrates a cross-sectional view of a portion of another embodiment of a perimeter BGA package or structure 60 according to the present invention. BGA package 60 comprises substrate 61 and support or base substrate 62. Support substrate 62 is shown with a heat spreading layer 63 formed on a lower surface of support substrate 62. Alternatively, heat spreading layer 63 is formed within support substrate 62 (shown as heat spreading layer 97 in FIG. 4). Heat spreading layer 63 preferably comprises a thermally conductive material such as copper, for example, and is formed using techniques well known in the art. Heat spreading layer 63 provides a means for removing heat generated by semiconductor die 18. Heat spreading layer 63 is easily incorporated into the design shown in FIG. 2. Support substrate 62 further includes a die attach pad 64. Semiconductor die 18 is attached to die attach pad 64 preferably using a die attach epoxy.

BGA package 60 further comprises a conductive connective structure that includes conductive traces or lines 66 formed on the upper surface of support substrate 62. Conductive traces 66 each terminate at one end with a bond post 67 and at an opposite end with a contact or coupling pad 68. The conductive connective structure further includes conductive traces 71 formed on a lower surface of substrate 61. Only one set of conductive traces is shown. Conductive traces 71 each terminate at one end with a contact or coupling pad 72 and terminate at an opposite end with a conductive ball pad or contact 73. Contact pad 72 is attached to contact pad 68, which couples support substrate 62 to substrate 61. Contact pad 72 is attached to contact pad 68 using a solder for example. Alternatively, contact pad 72 is laminated to contact pad 68 at high temperature using a conductive adhesive.

Conductive solder balls 26 are each attached to a conductive ball pad 73. The conductive connective structure of BGA package 60 is cost effective because it eliminates, in some cases, the need for vias. For example, in low lead count devices where the I/O density, line/space width, and overall package body size is appropriate. In higher pin count devices, the conductive connective structure of BGA package 60 is combined with vias, the vias being either between semiconductor die 18 and the inner-most row of conductive solder balls 26 (inner), along the outer periphery of substrate 61 (outer), or both inner and outer, and conductive traces along the top of substrate 61.

Wire bond or conductive wire 76 electrically connects bond pad 22 on semiconductor die 18 to a bond post 67. BGA package 60 includes a plurality of wire bonds, but only one is shown. Wire bond 76 is shown with a preferred low loop height bond. Wire bond 76 has a height 77 on the order of 0.125 mm, which is approximately half a standard wire bond loop height. A low loop height wire bond is preferred because it further provides for a reduced package thickness. Low loop height wire bonds are formed using commercially available wire bonding equipment. BGA package 60 is shown with a lid enclosure 78, which preferably comprises a laminated metal having an overall TCE that substantially equals the TCE of substrate 61. Lid enclosure 78 is preferably attached to substrate 61 using an epoxy.

Figure 4:
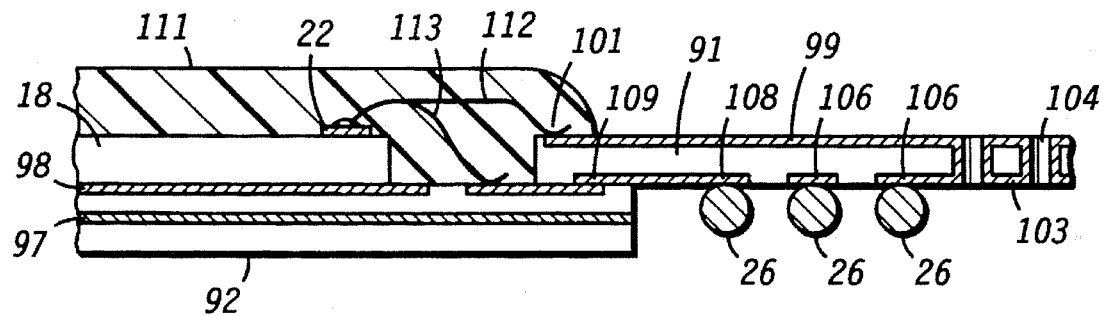
FIG. 4 illustrates a portion of a cross-sectional view of yet another embodiment of a perimeter BGA package according to the present invention.

FIG. 4 illustrates a portion of a cross-sectional view of a further embodiment of a perimeter BGA package or structure 90 according to the present invention. BGA package 90 comprises substrate 91 and support or base substrate 92. Support substrate 92 is shown with a heat spreading layer 97 formed within support substrate 92. Heat spreading layer 97 comprises a thermally conductive material such as copper and is formed using methods well known in art. Support substrate 92 is further shown with ground plane layer 98 formed on the upper surface of support substrate 92. Ground plane layer 98 preferably comprises a copper layer.

BGA package 90 further comprises a conductive connective structure including upper conductive traces 99 formed on the upper surface of substrate 91. Upper conductive traces 99 each terminate with a bond post 101 near an inner edge of substrate 91. Upper conductive traces 99 are electrically connected to lower conductive traces 103 through vias or plated through-holes 104. Lower conductive traces 103 each terminate with a conductive ball pad 106. Only one set of upper and lower conductive traces is shown. In this embodiment, vias 104 are shown near an outer edge of substrate 91. Although the placement of vias 39 in FIG. 2 are preferred, the placement of vias 104 is shown as an option. Upper conductive traces 99, lower conductive traces 103 and vias 104 are formed as described above.

The conductive connective structure further includes additional lower traces 107 formed on the lower surface of substrate 91. One end of each additional lower traces 107 has a conductive ball pad 108 and an opposite end has a contact or coupling pad 109. Contact pad 109 is shown coupled to a ground plane layer 98. Contact pad 109 is coupled to ground plane layer 98 using a solder, for example. Alternatively, contact pad 109 is laminated to ground plane layer 98 at an elevated temperature using a conductive adhesive.

In an optional embodiment, support substrate 92 includes conductive traces instead of or in addition to ground plane layer 98, depending on the application requirements. These optional conductive traces couple to additional lower traces 107, as described above. Conductive solder balls 26 are each attached to conductive ball pads 106 or 108 as described above.

Semiconductor die 18 is attached to ground plane layer 98 preferably using a die attach epoxy. Wire bonds 112 and 113 electrically couple bond pads 22 to the conductive connective structure. Here, wire bond 112 is shown coupled to a bond post 101 on one of the upper conductive traces 99. Wire bond 113 is coupled to ground plane layer 98. BGA package 90 is shown with a liquid encapsulant or glob-top enclosure 111, which covers semiconductor die 18, wire bonds 112 and 113 and at least a portion of substrate 91. Glob-top enclosure 111 is formed using techniques well known in the art.

In an embodiment where the wire bonds are coupled to bond posts on the support substrate only, the enclosure covers the semiconductor die, the wire bonds, and at least a portion of support substrate. This further reduces overall package height.

Figure 5:
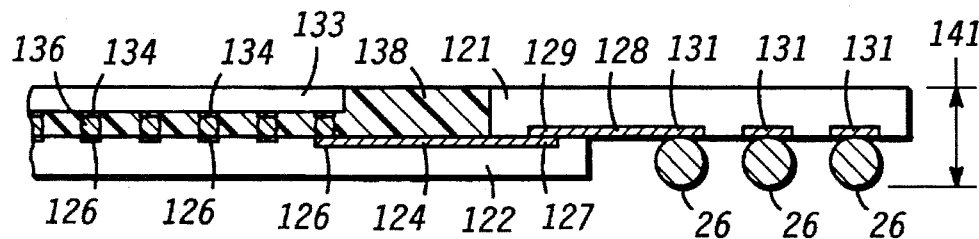
FIG. 5 illustrates a portion of a cross-sectional view of a further embodiment of a perimeter BGA package according to the present invention.

FIG. 5 illustrates a portion of a cross-sectional view of another embodiment of a perimeter BGA package or structure 120 according to the present invention. BGA package 120 is similar to the BGA packages shown in FIGS. 2–4 except for the die attach structure. BGA package 120 uses direct chip attachment (DCA) structure that eliminates the need for wire bonding. BGA package 120 comprises substrate 121 and support or base substrate 122.

BGA package 120 further comprises a conductive connective structure that includes conductive traces or lines 124, which are formed on the upper surface of support substrate 122. Conductive traces 124 each terminate at one end with a bond post or die contact pad 126 and at an opposite end with a contact pad 127. The conductive connective structure further includes conductive traces 128 formed on a lower surface of substrate 121. Only one set of conductive traces is shown. Conductive traces 128 each terminate at one end with a contact pad 129 and at an opposite end with a conductive ball pad 131. Contact pad 129 is attached to contact pad 127 using a solder. Alternatively, contact pad 129 is laminated to contact pad 129 at an elevated temperature with a conductive adhesive. The conductive connective structure further includes die solder balls 136 each coupled to one of bond pads 134 on semiconductor die 133. Die solder balls 136 comprise a material that flows at a higher temperature than conductive solder balls 26 and are coupled to bond pads 134 and die contact pads 126 using well known processes. BGA package 120 further includes encapsulant 138, which preferably does not cover the back side of semiconductor die 133 or substrate 121. This provides a height 141 on the order of 0.7 to 1.0 mm. BGA package 120 is shown with no vias. It is understood that vias (inner, outer, or inner and outer) can be easily incorporated to support higher pin count applications.

It is further understood that the embodiments shown in FIGS. 2–5 can be combined to produce a variety of low-profile BGA packages within the spirit of the disclosed invention.

By now it should be appreciated that there has been provided a low-profile BGA package that supports the electronic industry's desire for more reliable, smaller, lighter, thinner, and cost effective packages. The BGA package according to the present invention provides for a cost effective thin package with features that reduce strain in the solder joints and control the solder joint geometry to improve strain tolerance during temperature cycling.

In particular, the BGA package includes a support substrate that provides a low-profile and a structure that controls the collapse of the conductive solder balls when the BGA package is mounted to an application board. When the amount of collapse is controlled, the solder joints are taller than in standard BGA packages. Taller solder joints have been shown to be more reliable because the larger aspect ratio lowers solder joint strain. Also, by placing the vias between the semiconductor die and the conductive solder balls, the BGA package allows the manufacturer to place the conductive solder balls further away from the semiconductor chip, which reduces stress on the solder joints. In addition, the BGA package supports a variety of conductive connective structures that improves conductor routing to the package.

We claim:

1. A low-profile ball-grid array (BGA) semiconductor package for mounting to a printed circuit board (PCB) comprising:

a semiconductor die having a plurality of bonding pads;

a first substrate having a top surface, a bottom surface, a first width, a plurality of conductive ball pads formed on the bottom surface, and an opening extending from the top surface to the bottom surface, wherein the opening has a second width;

a plurality of conductive balls each coupled to a conductive ball pad;

a support substrate having an upper surface and a lower surface, wherein the support substrate has a width that is greater than the second width and less than the first width, and wherein the upper surface of the support substrate is coupled to the bottom surface of the first substrate, and wherein the semiconductor die is coupled to the upper surface of the support substrate within the opening, and wherein the support substrate is in close proximity to the PCB when the low-profile BGA semiconductor package is mounted to the PCB, and wherein the support substrate acts as a standoff to limit collapse of the plurality of conductive balls when the package is mounted to the PCB;

a conductive connective structure that couples each bonding pad to a conductive ball pad; and an enclosure covering at least a portion of the support substrate.

2. The package of claim 1 wherein the conductive connective structure includes a first conductive trace formed on the top surface of the first substrate, wherein the first conductive trace has a bond post at one end, a via extending from the top surface to the bottom surface of the first substrate, a second conductive trace formed on the bottom surface of the first substrate, wherein the second conductive trace has a conductive ball pad at one end, and a conductive wire coupled at one end to a bonding pad and coupled at an opposite end to the bond post, and wherein a conductive material is present in the via, and wherein the first conductive trace is coupled at an opposite end to the via, and wherein the second conductive trace is coupled at an opposite end to the via.

3. The package of claim 2 wherein the via is between the opening in the first substrate and an innermost portion of conductive balls.

4. The package of claim 1 wherein the conductive connective structure includes a first conductive trace on the upper surface of support substrate, wherein the first conductive trace has a bond post at one end and a conductive coupling pad at an opposite end, a conductive wire coupled at one end to a bonding pad and coupled at an opposite end to the bond post, and a second conductive trace formed on the bottom surface of the first substrate, wherein the second conductive trace has a conductive coupling pad at one end and the conductive ball pad at an opposite end, wherein the conductive coupling pad of the first conductive trace contacts the conductive coupling pad of the second conductive trace.

5. The package of claim 1 wherein the conductive connective structure includes a plurality of die contact pads formed on the upper surface of the support substrate, a plurality of die solder balls each coupled to a bonding pad and a die contact pad, a first plurality of conductive traces formed on the upper surface of the support substrate, each coupled at one end to a die contact pad and coupled at an opposite end to a conductive ball pad.

6. The package of claim 1 wherein the first substrate and the support substrate comprise an organic epoxy-glass resin.

7. The package of claim 1 wherein the support substrate comprises a different material than the first substrate.

8. The package of claim 1 wherein the support substrate comprises a stress reducing material.

9. The package of claim 8 wherein the support substrate comprises aluminum-nitride.

10. The package of claim 1 wherein the enclosure comprises a liquid encapsulant enclosure.

11. The package of claim 1 wherein the enclosure comprises a transfer molded enclosure.

12. The package of claim 1 wherein the enclosure comprises a lid, wherein the lid is attached to the top surface of the first substrate with an epoxy.

13. The package of claim 1 wherein the support substrate includes a heat spreading layer.

14. A perimeter ball-grid array (BGA) semiconductor structure comprising:

a substrate structure having a first substrate attached to a first major surface of a base substrate, wherein the first substrate has a substantially centrally located aperture extending from a first surface to a second opposed surface to form a cavity with at least a portion of the first major surface of the base substrate providing one cavity surface, and wherein the substrate structure includes a conductive connective structure comprising a first plurality of conductive lines formed on the first surface and terminating into a first plurality of bond posts and a second plurality of conductive lines formed on the second opposed surface and terminating into a first plurality of conductive ball contacts, the first plurality of conductive lines being electrically connected to the second plurality of conductive lines;

an integrated circuit chip having a first surface and a second opposed surface, wherein the integrated circuit chip has a plurality of conductive bond pads formed on the first surface of the integrated circuit chip, and wherein the integrated circuit chip is attached to the base substrate within the cavity, and wherein the plurality of conductive bond pads is electrically connected to the first plurality of conductive ball contacts;

a plurality of conductive balls, each attached to one of the first plurality of conductive ball pads, wherein the base substrate provides a standoff to limit collapse of the plurality of conductive balls thereby controlling solder joint height when the substrate structure is coupled to an application substrate; and an enclosure covering at least a portion of the base substrate.

15. The structure of claim 14 further comprising a first plurality of conductive wires each electrically connecting one of plurality of conductive bond pads to one of the first plurality of bond posts, a third plurality of conductive lines formed on the first major surface of the base substrate and terminating into a second plurality of bond posts, a second plurality of conductive wires each electrically connecting one of the plurality of conductive bond pads to one of the second plurality of bond posts, and a fourth plurality of conductive lines formed on the second opposed surface of the first substrate terminating into a plurality of contact pads on one end and into a second plurality of conductive ball contacts on an opposite end, wherein the third plurality of conductive lines is electrically connected to the fourth plurality of conductive lines through the plurality of contact pads, and wherein each of the second plurality of conductive ball contacts has a conductive ball attached thereto.

* * * * *